(12) United States Patent
Han et al.

(10) Patent No.: US 6,508,911 B1
(45) Date of Patent: Jan. 21, 2003

(54) DIAMOND COATED PARTS IN A PLASMA REACTOR

(75) Inventors: Nianci Han, San Jose; Hong Shih, Walnut; Jennifer Y. Sun, Sunnyvale; Li Xu, San Jose, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/375,243

(22) Filed: Aug. 16, 1999

(51) Int. Cl.$^7$ .................................................. H05H 1/00
(52) U.S. Cl. .................. 156/345; 118/723 R; 118/723 I
(58) Field of Search ........................ 156/345; 118/715, 118/723 R, 723 E, 723 I

(56) References Cited

U.S. PATENT DOCUMENTS

| | | | |
|---|---|---|---|
| 3,840,451 A | 10/1974 | Golyanov et al. | 204/192 |
| 4,767,517 A | 8/1988 | Hiraki et al. | 204/192.25 |
| 4,882,138 A | 11/1989 | Pinneo | 423/446 |
| 5,023,056 A | 6/1991 | Aklufi et al. | 422/186 |
| 5,074,456 A | 12/1991 | Degner et al. | 228/121 |
| 5,075,095 A | 12/1991 | Pinneo | 423/446 |
| 5,219,485 A | 6/1993 | Wang et al. | 252/79.3 |
| 5,268,200 A | 12/1993 | Steger | 427/249 |
| 5,271,971 A | 12/1993 | Herb et al. | 427/577 |
| 5,284,709 A | 2/1994 | Herb et al. | 428/408 |
| 5,387,556 A | 2/1995 | Xiaobing et al. | 437/228 |
| 5,432,003 A | 7/1995 | Plano et al. | 428/408 |
| 5,449,434 A | 9/1995 | Hooke et al. | 216/70 |
| 5,496,596 A | 3/1996 | Herb et al. | 427/577 |
| 5,531,834 A * | 7/1996 | Ishizuka et al. | 118/723 |
| 5,545,030 A | 8/1996 | Pinneo | 428/408 |
| 5,571,615 A | 11/1996 | Phillips et al. | 428/336 |
| 5,571,616 A | 11/1996 | Phillips et al. | 428/336 |
| 5,607,723 A | 3/1997 | Plano et al. | 427/249 |
| 5,633,088 A | 5/1997 | Pinneo | 428/408 |
| 5,728,465 A | 3/1998 | Dorfman et al. | 428/408 |
| 5,740,009 A | 4/1998 | Pu et al. | 361/234 |
| 5,812,362 A | 9/1998 | Ravi | 361/234 |
| 5,874,014 A | 2/1999 | Robson et al. | 216/68 |
| 5,902,675 A | 5/1999 | Pinneo | 428/323 |
| 5,910,221 A | 6/1999 | Wu | 118/723 R |
| 5,952,060 A | 9/1999 | Ravi | 427/577 |
| 6,190,495 B1 * | 2/2001 | Kubota et al. | 156/345 |

FOREIGN PATENT DOCUMENTS

| | | | |
|---|---|---|---|
| DE | 43 00 223 A1 | 7/1994 | |
| EP | 0 849 767 A2 | 6/1998 | H01J/37/32 |

OTHER PUBLICATIONS

"Influence of forced diffusion of boron on electrical conductivity of diamond films,"*III–Nitride, SiC and diamond Materials for Electronic Devices*, Materials Research Society Symposium Proceedings, vol. 423, 1996, pp. 649–654.
Linke, et al.; "Behavior of Boron–Doped Graphites, Plasma–Sprayed $B_4C$, and a C/B:H as Plasma–Facing Materials"; Fusion Technology; vol. 20; Sep., 1991; pp 228–231.

\* cited by examiner

*Primary Examiner*—Thi Dang
(74) *Attorney, Agent, or Firm*—Charles S. Guenzer; Joseph Bach

(57) ABSTRACT

A diamond coating formed on a bulk member used in a plasma processing chamber for processing a substrate such as a semiconductor wafer. The coating is particularly useful in a plasma etching chamber using a chlorine-based chemistry to etch metal. One class of such parts includes a dielectric chamber wall, in particular, a chamber wall through which RF or microwave energy is coupled into the chamber to support the plasma. For example, an RF inductive coil is positioned outside the chamber wall and inductively couples energy into the chamber. Exemplary substrates for the diamond coating include alumina, silicon nitride, silicon carbide, polysilicon, and a SiC/Si composite. Amorphous carbon may be substituted for diamond.

40 Claims, 4 Drawing Sheets

DIAMOND COATED PARTS IN A PLASMA REACTOR

FIELD OF THE INVENTION

The invention relates generally to plasma reactors and their operation. In particular, the invention relates to the composition of parts of the chamber facing the plasma in a plasma etch reactor.

BACKGROUND ART

Dry plasma etching is the preferred process for etching features on a silicon wafer being fabricated into semiconductor integrated circuits. Typically, one or more planar layers are deposited over the previously defined substrate, and a layer of photoresist mask or a hard mask is deposited over the planar layers and patterned to leave apertures exposing portions of the planar layers. An etching gas admitted into the etching reactor is then excited into a plasma state, and it acts on the portions of the planar layers exposed by the mask to remove those exposed portions. The dry plasma etching process has proved to be very effective at defining extremely small features with low production of deleterious particles.

The field of plasma etching is typically divided among silicon etching, oxide etching (typically of $SiO_2$), and metal etching. Each uses its preferred chemistry and presents its own problems. However, many problems are common among them, and the etching chambers dedicated to different ones of the uses tend to resemble each other.

The most prevalent use of metal etching is to define interconnects (and accompanying contacts or vias) in a layer of aluminum or aluminum alloy deposited over an interlayer dielectric. Recently, copper interconnects have been developed. Once the generally planar aluminum layer has been deposited over the interlayer dielectric and into the contact or via holes, a photomask is deposited and defined over the aluminum layer. Then, an etching gas is admitted into the plasma etch chamber and excited into the plasma state. A typical etching gas is a halide-containing gas, usually F, Cl, or Br. The halogen reacts with the material being etched to typically form a volatile byproduct. It has long been known that a chlorine-based chemistry is effective at etching aluminum. See, for example, U.S. Pat. No. 5,387,556 to Xiaobing et al. Gaseous hydrochloric acid (HCl) is the prototypical chlorine-based etchant. However, HCl is no longer considered the optimum aluminum etchant.

Aluminum quickly forms an overlying layer of a native oxide of alumina ($Al_2O_3$) and related materials forming a residue over the metallic aluminum being etched. Alumina is a relatively stable material and resistant to reductive breakdown, even by HCl. For these reasons, a plasma etch of boron trichloride ($BCl_3$), often in conjunction with HCl or $Cl_2$, is typically used for etching aluminum and its alloys. Wang et al. in U.S. Pat. No. 5,219,485 use a similar chemistry to etch silicides in order to avoid residues from the silicide etch.

However, the use of a powerful chlorine-based etchant like $BCl_3$ introduces a problem originating from the fact that the chamber body is most economically made of aluminum, for example the alloy A16061-T6, and the chamber dome is usually made of alumina. The seminal problem is that a chamber having an aluminum body and which is used for etching aluminum must balance the etching of the aluminum portion of the substrate against the etching of the chamber body. Typically, the aluminum chamber body is anodized, that is, electrochemically processed to be covered with a moderately thin coating of alumina, to provide some protection for the aluminum. Nonetheless, though usually to a lesser extent, a chlorine-based etchant can also attack the alumina, whether in the dome or the thin anodized layer on the chamber body. The physical integrity of the aluminum chamber and alumina dome are important, but a more important problem arises from the fact that the etching of these parts is likely to produce aluminum-based particles that deleteriously fall on the wafer and reduces the yield of functioning integrated circuits. As a result, the chamber wall in a plasma reactor intended for aluminum etching advantageously should not be composed of aluminum, even with a coating of alumina. Alumina is relatively resistant to a chlorine-based etch, though not impregnable. However, as will be explained later, fluorine is often also used, which more readily etches alumina.

In U.S. patent application Ser. No. 08/770,092 filed Dec. 19, 1996, Shih et al. (including the two present inventors plus others) describe a protective coating of boron carbide (nominally $B_4C$) applied to the aluminum chamber walls. A similar disclosure appears in European Patent Application EP-849,767-A2. This patent application is incorporated herein by reference in its entirety. The boron carbide coating has been applied to a high-density plasma reactor, known as the Decoupled Plasma Source (DPS) Metal Etch Chamber available from Applied Materials, Inc. of Santa Clara, Calif.

A schematic representation of the commercial DPS chamber is illustrated in the cross-sectional view of FIG. 1. An upper, main processing compartment 10 is bounded by a curved ceramic dome 12 typically of alumina, an upper housing 14 typically of aluminum to which the ceramic dome 12 is sealed, and a movable pedestal wall 16 that is vertically movable to engage and seal within an inwardly extending annular shelf 18 of the upper housing 14. The upper housing 14 rests on and is sealed to a lower housing 20, and a bellows 22 is sealed to the bottom of the lower housing 20 and to a stem 24 extending downwardly from the pedestal wall 16. An electrode 19 may be included at the center of the dome 12. A lower compartment 26 is defined generally by the walls of the lower housing 20 and the lower edge of the annular shelf 18. During plasma processing, the movable pedestal wall 16 seals the upper compartment 10 from the lower compartment 22 by engaging and sealing itself to the annular shelf 18 of the upper housing 14.

A vertical actuator 28 connected to the bottom of the stem 24 can move the pedestal wall 16 into and out of engagement with the annular shelf 18. An unillustrated robot blade can transfer a wafer 30 into the lower compartment through a loadlock slit 32 in the lower housing 20 and its unillustrated slit valve when the vertical actuator 28 has lowered the pedestal wall 16 to a position to receive the wafer 30 on its upper surface. The pedestal wall 16 typically includes an electrostatic chuck to selectively hold the wafer 30 by electrostatic attraction exerted by an electrical signal applied to the chuck. After the wafer has been placed on the pedestal wall 16, the vertical actuator 28 raises the pedestal wall 16 so that it seals the upper compartment 10 and places the wafer within the upper compartment 10.

The upper housing 14 also includes a turbo port 38 connecting to an integral pumping stack 40. A vacuum pumping system 42 mated with the bottom of a pumping stack 40 pumps the upper compartment 10 as well as the lower compartment 26 when it is opened to the upper compartment 10. A poppet valve 44 fixed to the upper housing 14 over the pumping stack 40 can selectively isolate the upper compartment 10 from the vacuum pumping system 42.

Processing gas, which for etching aluminum typically includes $BCl_3$ and $Cl_2$ as well as possibly $CF_4$, $CHF_3$, $N_2$, Ar, etc., is injected into the sealed upper compartment 10 through a plurality, typically four, of unillustrated gas nozzles fixed to the radially inner ends of respective gas orifices 46 penetrating the upper housing 14 near its top. RF power is applied to an inductive coil 48 wrapped around the curved dome 12 so as to create a high-density plasma of the processing gas within the upper compartment 10. RF power is also applied to the wafer pedestal 16 and possibly to an unillustrated counter electrode fixed in middle of the curved dome 12 so as to bias the plasma to effect the desired etching of the wafer.

According to Shih et al., a coating of boron carbide is plasma sprayed onto the inside of the aluminum chamber housing 14 to protect it from the chlorine plasma. Although the original disclosure suggests coating only an upper portion of the chamber wall 14 in a band around the gas ports 46 and leaving the lower portion as anodized aluminum, more recent results show the advantage of extending the boron carbide coating to all portions of the aluminum chamber wall 14 exposed to the plasma. Plasma-sprayed boron carbide has proven to be extremely durable against a chlorine plasma, particularly with the extended wall coverage. While in the past metal etch chamber walls needed to be replaced after approximately 20,000 wafers were etched, the $B_4C$-coated wall has been used for more than 100,000 wafers. Such a lifetime typically defines the demarcation between a consumable part subject to contractually enforced minimum lifetimes and a non-consumable part not subject to further contract limitations.

The boron carbide coating, however, has not solved the entire durability problem associated with chlorine-based plasma etching because boron carbide cannot be beneficially coated onto all chamber parts. A schematic illustration of DPS chamber of FIG. 1 is presented in FIG. 2 emphasizing its electrical characteristics. The wafer pedestal 16 is usually electrically conductive and is electrically biased by a bias RF power supply 50 though an RF coupling capacitor 52 so as to control the DC self-bias seen by the wafer 30. The DC self-bias controls the energy of plasma ions drawn across the plasma sheath and incident on the wafer 30. The $B_4C$-coated chamber wall 14 is typically electrically grounded or at a minimum held at a predetermined DC potential to define a grounding plane (or anode) relative to the RF biased pedestal electrode 16. The chamber wall 14 is thus usually formed of a metal, preferably aluminum for reasons of economy. Boron carbide in its pure crystalline forms is a semiconductor with a bandgap of about 1.6 eV. Typical electrical resistivities are 0.1 to 1 ohm-cm at room temperature and 0.038 ohm-cm at 600° C. Boron carbide thus has sufficient electrical conductivity to extend the grounding into the interior of the chamber, particularly at the higher temperatures experienced in HDP etching.

The DPS chamber is a high-density plasma (HDP) reactor, a high-density plasma being defined as having an ionization density of at least $10^{11} cm^{-3}$ throughout the region it extends with the except of plasma sheaths. Most of the plasma power is inductively coupled into the chamber by the inductive coil 48 wrapped around the dome 12 and powered by a source RF power supply 58. The actual electrical connections to the inductive coil 48 are more complex than the single direct connection illustrated. The power applied to the coil 48 creates an RF magnetic field inside the chamber, which induces a circumferential electric field that powers the plasma. However, at these high frequencies an electrically conductive dome 12 would short the RF magnetic field. As a result, the electrical resistivity of the dome 12 must be high, and it is usually composed of an insulative ceramic.

The most typical ceramic material for the dome is α-alumina having a resistivity of over $10^{12}$ ohm-cm in its purer forms. It has a chemical composition of approximately $Al_2O_3$, to about 99.5% or higher, but some silica is usually included in commercial products. Alumina is widely used in semiconductor fabrication equipment and is economically available in large, complex shapes. However, we have found that an alumina dome causes substantial problems in an HDP metal etch reactor.

Visually, three zones seem to develop within the dome that are differently affected by either a chlorine-based etchant or a chlorine-based etchant with additional fluorocarbon. As illustrated in FIG. 2, an inner zone 60 at the middle of the alumina dome 12 not having the inductive coil 48 as its back suffers relatively little damage although sometimes it is covered by a polymeric coating. Scanning electron micrographs (SEMs) show an unetched or slightly etched, compacted granular structure. A coil zone 62 is formed as an annular region generally located beneath the innermost windings of the inductive coil 48 show substantial damage. The alumina is etched into pinnacles having diameters of a few hundred nanometers. It is believed that the pinnacles had been separated by grain boundaries prior to etching. It is further believed that the pinnacles eventually break off, probably when the bottom grain boundaries are reached, and they cause a severe particle problem. An edge zone 64 is formed as an annular region generally located beneath the outermost windings of the coil 48 and also beneath the outer coil-free region of the dome. Under some conditions, the edge zone 64 is etched, but into more of a cavernous structure than in the coil zone 62. Under other conditions, the edge region 64 is covered with a dark polymeric coating and it left unetched. In all cases, etching of the grain boundaries is observed. It is believed that the grain boundaries include a silicon-rich glassy phase that is easily attacked by either chlorine or fluorine. However, at the coil zone 62 or edge zone 64, all portions are observed to be etched. The dome etching is likely to produce tiny alumina particles which fall onto the wafer causing defects. The addition of a fluorocarbon tends to increase the observed polymerization A further problem with using alumina as the dome material arises from the need to etch relatively deep ($\approx 1 \mu m$) and narrow (less than 0.25 $\mu m$) holes into the metal. Some sidewall passivation is needed with these high aspect ratios. A fluorocarbon gas such as carbon tetrachloride ($CF_4$) is sometimes added to the plasma etching gas and to deposit as a protective polymer on the vertical sidewalls. However, such a fluorocarbon plasma, because it is fluorine-based, attacks alumina, thereby forming volatile CO or $CO_2$ and harmful $AlF_3$ particulates.

Clearly, uncoated alumina is unsatisfactory for the dome material in the reactor of FIGS. 1 and 2. A more robust material is desired.

A first approach to solving the dome problem would be to coat it with boron carbide. While such an approach may work with proper constraints, boron carbide introduces inherent design problems. Boron carbide has a low but finite electrical resistivity in the range of 0.04 to 1 ohm-cm. In view of the need for 100,000-wafer lifetimes, significant film thicknesses are required even for small erosion rates. For $B_4C$-coated aluminum, Shih et al. suggest a minimum coating thickness of 125 $\mu m$, and a thickness of 1 mm would be desirable for a margin of error. Such thicknesses of boron carbide present too high a resistive loss when used inside an RF inductive coil.

Silicon or more specifically polysilicon has been used as a dome material in oxide etching since its resistivity can be increased to almost 200 ohm-cm. However, silicon is expensive, prone to cracking, and is subject to some etching. For metal etching in the DPS chamber, even the stated resistivity for polysilicon is believed to be insufficiently high for an RF window.

Steger has suggested in U.S. Pat. No. 5,268,200 the use of a conductive carbon coating on metal walls in a plasma etching chamber. Steger does not specify the crystallographic state of the metal coating, but in view of its low electrical resistivity (less than $2\times10^{-4}$ ohm-cm) and low formation temperature (below 500° C.), it is likely graphitic. The very high electrical conductivity makes Steger's coating unsuitable for coating a dome.

Thus, no satisfactory dome material or dome coating has to date been found.

SUMMARY OF THE INVENTION

Accordingly, an object of the invention is to provide a protective coating suitably formed over a ceramic coating that has a high electrical resistivity but is not significantly etched by a plasma, particularly a chlorine-based plasma.

According to one aspect of the invention, a diamond layer is coated onto an insulating substrate, particularly a ceramic one, used in a plasma reactor.

In a particular aspect of the invention, the diamond coating is applied to a chamber wall behind which is wound an RF inductive coil.

Diamond coatings can be advantageously applied to alumina, silicon nitride, silicon carbide, or polysilicon bulk substrates.

DETAILED DESCRIPTION OF THE PREFERRED EMBODIMENTS

Figure 3:
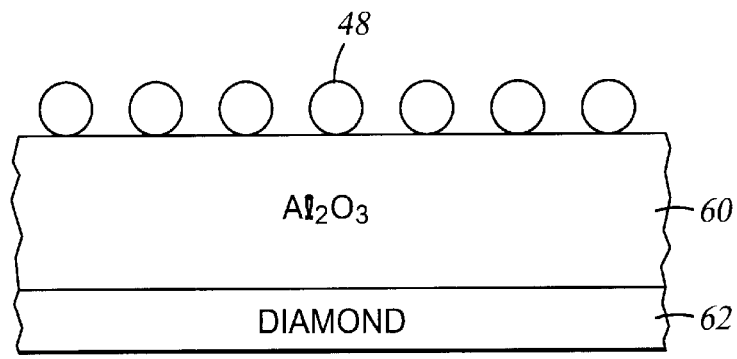
FIGS. 3–5 are cross-sectional views of three embodiments of the invention including a diamond coating on an insulating and usable as a dielectric wall of a plasma reactor.

A diamond layer coated onto a dielectric substrate provides much increased resistance to corrosion from a high-density plasma. In a first embodiment illustrated in the cross-sectional view of FIG. 3, an alumina substrate 60 corresponds to the dome 12 or other chamber part, and the RF inductive coil 48 may be positioned at the back of the alumina substrate 60 to form a high-density plasma at its front. The front side of the alumina substrate 60 facing the plasma is covered with a relatively thick layer 62 of diamond. Other dielectric ceramics, whether oxide or otherwise, for example, silicon nitride, may be substituted for alumina.

Diamond has long been known as a very hard, chemically resistant material. In recent years, methods have been developed to deposit diamond as a thin layer on other materials. Chemical vapor deposition (CVD) of diamond films has been well developed. See, for example, U.S. Pat. No. 5,496,596 to Herb et al. and U.S. Pat. No. 5,902,675 to Pinneo. CVD of diamond is typically performed using a microwave source to create a plasma of the precursor gas, by using a hot filament to thermally activate the process, or by a combination of the two. The typical CVD process for depositing diamond involves a precursor gas of about 1% methane and 99% hydrogen, but other process recipes are available. The substrate is held at about 700 to 900° C. for the formation of carbon into the diamond crystalline structure, which is only metastable at lower temperatures. Foundry deposition of CVD diamond is commercially available from Crystallume, Inc. of Santa Clara, Calif. Norton also has extensive expertise in diamond films. Other methods of depositing diamond are not precluded.

Diamond forms in a tetrahedral crystalline structure as does silicon. It can be classed as a semiconductor with a bandgap of about 5.4 eV. Unless it is doped, it is a good dielectric with a high resistivity. Dorfman et al. list many diamond dopants in U.S. Pat. No. 5,728,465. Sung et al. investigate in more detail a few preferred dopants in "Influence of forced diffusion of boron on electrical conductivity of diamond films," included in *III-Nitride, SiC and Diamond Materials for Electronic Devices*, Materials Research Society Symposium Proceedings, vol. 423, 1996, pp.649–654.

Diamond is well known as a corrosion-resistant materials, and it has been coated on cutting tools. Ravi in U.S. Pat. No. 5,812,362 has disclosed coating diamond onto an electrostatic chuck having a conductive silicon pedestal. He suggests that such an electrostatic chuck may be used in a plasma etching chamber using fluorine-based chemistries.

A standardized chlorine-based plasma etching test was used to measure erosion rates of various materials. The etching gas included $BCl_3$, $Cl_2$, and Ar in a recipe typically used in etching aluminum The test was applied to alumina as conventionally used for dielectric domes, to boron carbide, and to free-standing diamond, which is formed by coating a graphite substrate with CVD diamond and then removing the graphite. Erosion rates were measured by weight loss.

TABLE 1

| | Erosion Rate (nm/hr) |
|---|---|
| $Al_2O_3$ | 1571 |
| $B_4C$ | 20.6 |
| Free Standing Diamond | 3.8 |
| Diamond on $Si_3N_4$ | 10.9 |
| Diamond on SiC | 35.6 |

When a fluorocarbon $CF_4$ is added, the alumina etch rate is approximately halved, but in general the diamond, whether in a coating or free standing, is covered with a protective polymer and is not etched at all.

It is seen that alumina has an unacceptably high etching rate in the chlorine plasma. The erosion rate for diamond is reduced over the alumina rate by a factor of about 400, and it is even less than that for boron carbide.

Coating diamond on alumina by the known CVD processes, however, has inherent problems arising from the need to hold the substrate at least 600° C. during the film forming. Alumina and diamond have substantially different coefficients of thermal expansion α, as shown in TABLE 2. Values of resistivities ρ are also given, but these tend to strongly depend both upon preparation and, in the case of semiconductors, upon the temperature. The resistivities given here are for the temperature range from room temperature to 600° C. and are representative of materials with high purity and no intentional doping.

The resistivitives presented are for natural diamond. Synthetic and thin-film diamond have somewhat lower resistivities, 1 to 100 ohm-cm at room temperature. Thus, diamond is easily distinguished from the other crystallographic forms of carbon not only by X-ray crystallography but also by its electrical resistivity of above 1 ohm-cm at room temperature, and even above 10 ohm-cm at room temperature.

TABLE 2

|  | α ($10^{-6}/°$ C.) | ρ (ohm-cm) |
| --- | --- | --- |
| Diamond | 1.2 | $10^3$–$10^{12}$ |
| $B_4C$ | 5.0 | 0.04–100 |
| $Al_2O_3$ | 7.4 | >$10^{12}$ |
| $Si_3N_4$ | 3.0 | $2 \times 10^{13}$–$10^{14}$ |
| Si | 5.6 | <100 |
| SiC | 4.6 | $10^{-3}$–$10^6$ |

The coefficient of thermal expansion for diamond depends greatly on preparation, but the stated value is representative of CVD diamond. Nonetheless, it is significantly lower than that of alumina. As a result, the differential thermal expansion (or properly contraction) as the diamond-coated substrate cools from 600° C. or higher to room temperature is likely to cause some cracking or even delamination of the diamond film. At a minimum, substantial stress will develop in the film and at the film-substrate interface. Further thermal cycling, even across the reduced temperature ranges associated with plasma etching, will introduce reliability concerns.

For these reasons, alternative dielectric substrates need to be considered.

Figure 4:
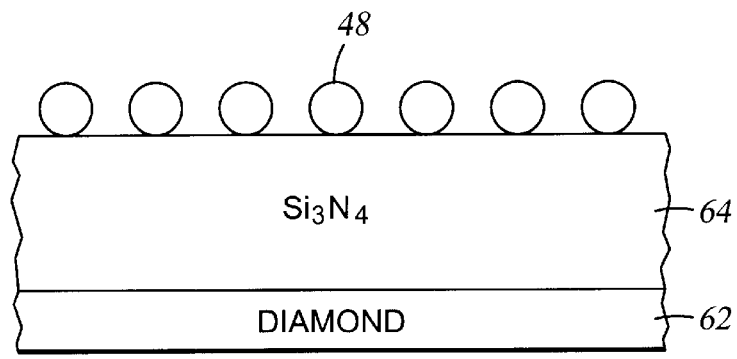

A second embodiment of the invention is illustrated in the cross-sectional view of FIG. 4 and includes a substrate 64 of silicon nitride, nominally $Si_3N_4$ but materials of composition $SiN_x$, with 1>x>1.5 are included. Silicon nitride can be formed into complex shapes by sintering. Silicon nitride is more closely matched in thermal expansion to diamond, and it usually has a high resistivity. Complex shapes of silicon nitride are available although at some cost. It is a strong, tough material.

As shown in TABLE 1, the erosion rate for diamond coated onto silicon nitride is higher than that for freestanding diamond, probably because of the stresses induced by differential thermal expansion. Nonetheless, the erosion rate is reduced by a factor of over 150 compared to that of alumina. At this erosion rate, a diamond thickness of 40 to 60 μm provides a coating lifetime of about 4000 hours of etching time. This is considered sufficient to meet the requirement of a dome lifetime sufficient to process 100,000 wafers.

Figure 5:
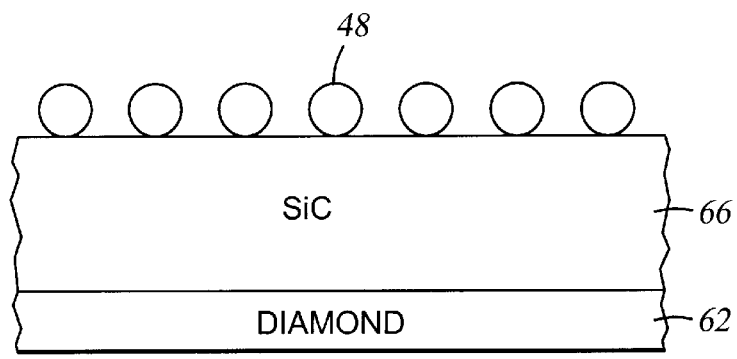

A third embodiment of the invention, illustrated in the cross-sectional view of FIG. 5, includes a substrate 66 of silicon carbide, nominally SiC. Sintered silicon carbide is widely available in large, complex shapes at reasonable prices. It is very durable and conducts heat well. Its coefficient of thermal expansion is better matched to diamond than is alumina but worse than is silicon nitride. It is usually considered a dielectric, but it can be doped to be electrically conductive.

As tabulated in TABLE 1, the erosion rate for diamond coated on silicon carbide is greater than corresponding values for free-standing diamond or diamond on silicon nitride, possibly because of the greater thermal expansion mismatch experienced in the coating process. Nonetheless, its etching rate is still greatly reduced over the rate for alumina.

Wu et al. have described a silicon carbide composite article in U.S. patent application, Ser. No. 08/878,223, filed Jun. 18, 1997, issue fee paid, and incorporated herein by reference in its entirety. The composite includes different simple silicon carbide parts bonded together in a more complex shape that is usable in a plasma reactor. In some applications, the different sub-parts have different electrical resistivities. The diamond coating of this invention can advantageously be formed on such a silicon carbide composite. One example is a flat roof for an inductively coupled plasma reactor with a various channels formed in the roof for the coil and for heating lamps. A diamond coating can be applied to the interior surface of the silicon carbide roof, either before or after the bonding of the silicon carbide parts.

Figure 6:
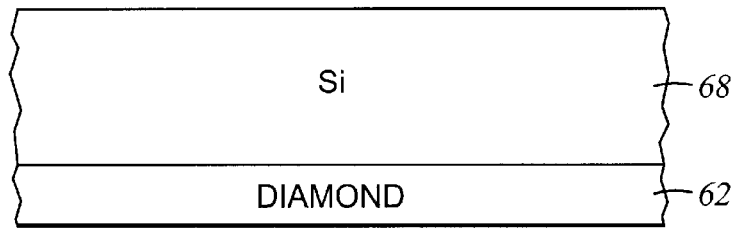
FIG. 6 is a cross-sectional view of a fourth embodiment of the invention including a diamond coating on a polysilicon substrate.
Figure 7:
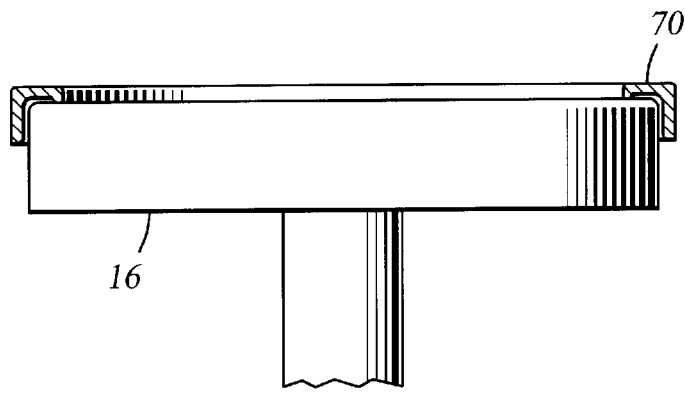
FIG. 7 is a cross-sectional view of a specific embodiment of a reactor part incorporating the fourth embodiment of FIG. 6.

A fourth embodiment of the invention, illustrated in the cross-sectional view of FIG. 6, includes a substrate 68 of silicon, usually in the form of polysilicon. Polysilicon is available in very pure forms and in relatively large, complex shapes, although at some cost. Although usually considered a semiconductor, it can be made semi-insulating at lower temperatures with resistivities of about 1 ohm-cm or even somewhat higher. It is not well thermally matched to diamond, but because of the covalent bonding of both materials, the diamond-silicon interface is very strong. Although its resistivity is considered too low for use as a dome, diamond on silicon can be advantageously used in other parts of the plasma chamber allowing conductive members. For example, as illustrated in cross-sectional view of FIG. 7, an annular ring member 70 is formed of polysilicon coated on all sides with diamond. The ring member 70 may be used as a plasma guard or as a plasma focus ring resting on the wafer pedestal 16 just outside of the supported wafer. An unillustrated inwardly extending circumferential overhang may be used as a shadow mask to prevent deposition on the outer periphery of the wafer. It may alternatively be used as a wafer clamp holding the periphery of the wafer against the pedestal 16. In some applications, it is advantageous to coat only one side of the ring member 70, for example, when the polysilicon is doped conductive and is to be electrically contacted to the pedestal 16 but to be insulated from the plasma. The precise cross-sectional shape of the ring member 70 depends on its application and specifics of its design.

Figure 8:
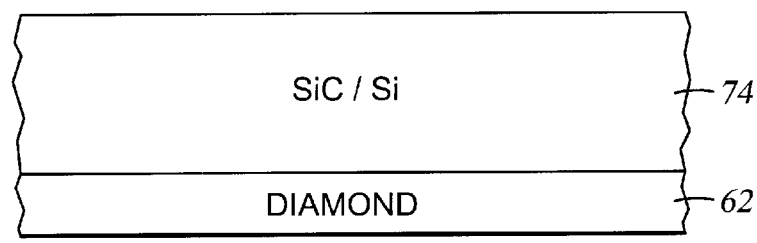
FIG. 8 is a cross-sectional view of a fifth embodiment of the invention including a diamond coating on a SiC/Si composite substrate.

A fifth embodiment of the invention, illustrated in the cross-sectional view of FIG. 8, includes a composite substrate 72 of SiC and Si coated with the diamond layer 62 on the side facing the plasma. Silicon carbide often forms in a spongy matrix with significant voids between the silicon carbide material. In the SiC/Si composite, silicon is melted into and fills the voids. Such a composite can be molded into large complex shapes. Even polycrystalline silicon (polysilicon) is a semiconductor with significant electrical conductivity. As a result, the composite substrate 72 is electrically conductive and thus can be used in place of aluminum for chamber parts that need to be electrically controlled, such as the grounded chamber wall 20 of the DPS chamber of FIG. 1. Nonetheless, the SiC/Si composite can withstand the high temperatures associated with the diamond coating process.

Figure 2:
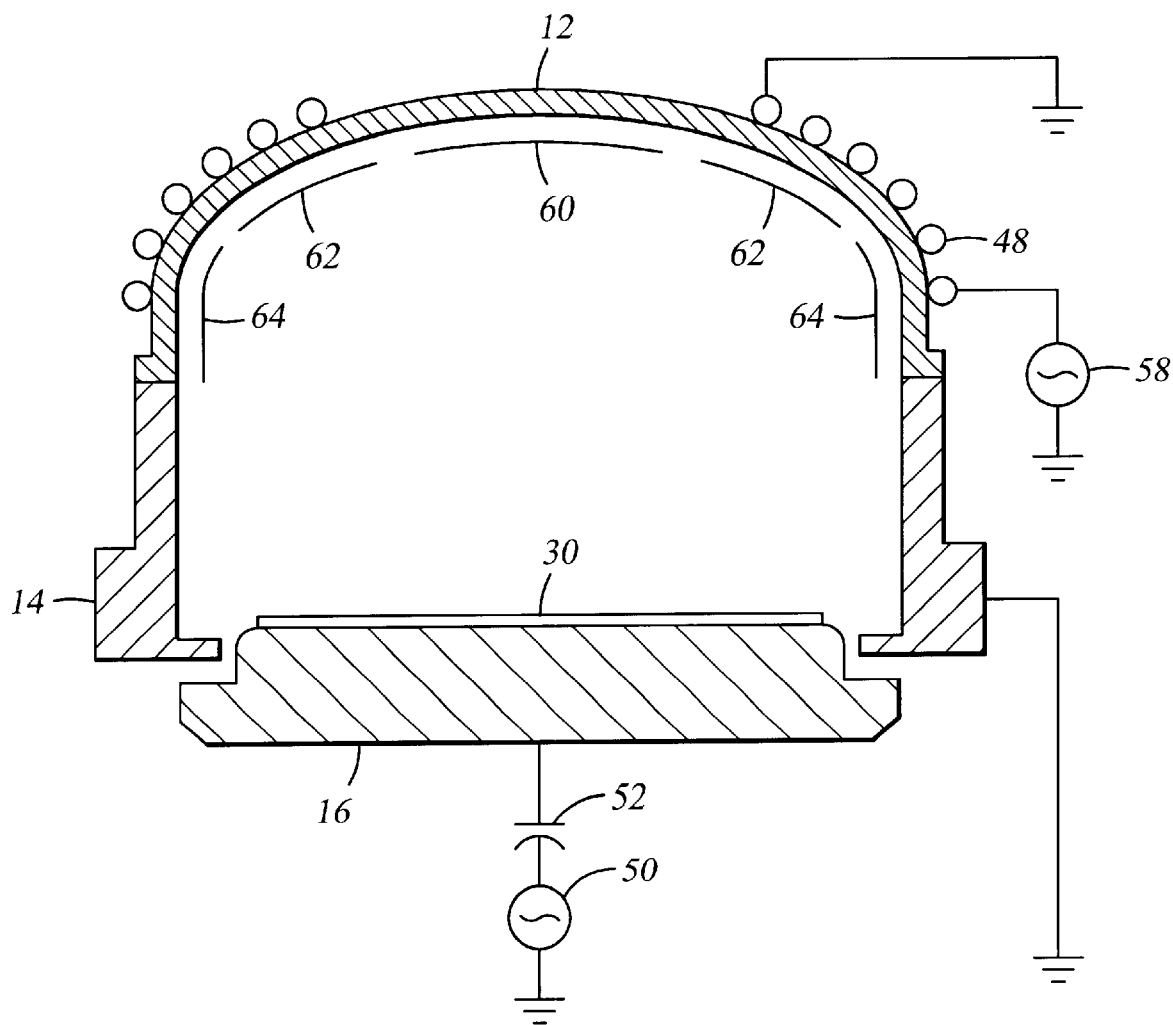
FIG. 2 is a yet more schematic cross-section view of the plasma reactor of FIG. 1 emphasizing the electrical characteristics of the reactor.
Figure 9:
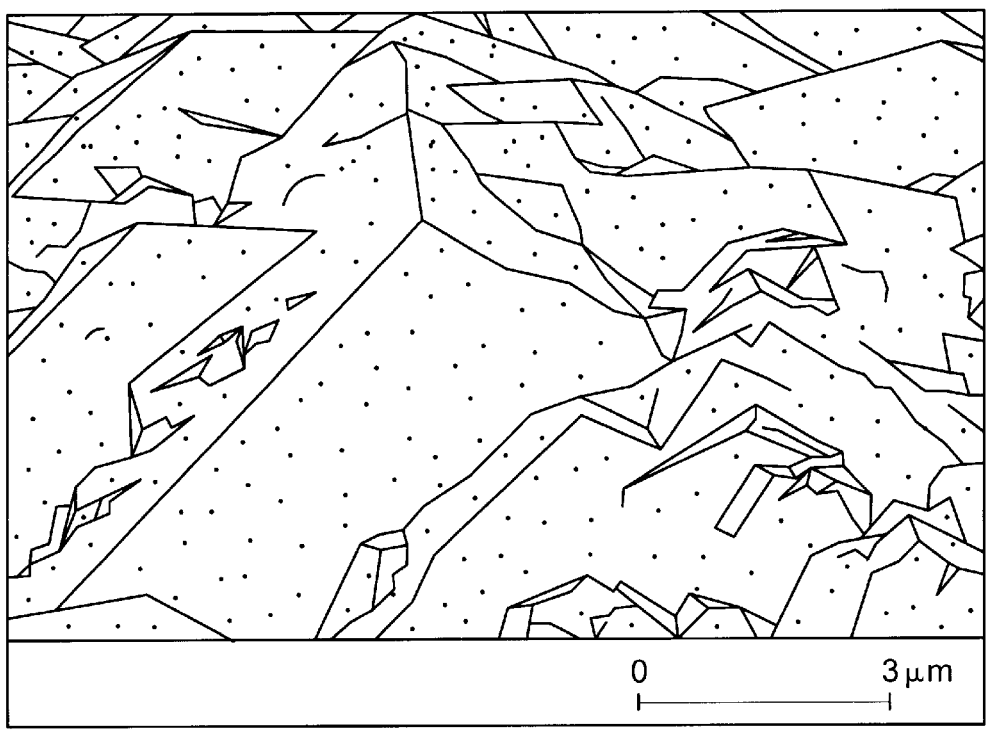
FIG. 9 is a representation of the microscopic surface morphology of a diamond coating.

It is possible to grow diamond by CVD into layers having very smooth surfaces, as is disclosed by Phillips et al. in U.S. Pat. No. 5,571,616. However, for parts within a semiconductor processing chamber, it is often advantageous to obtain a rougher surface. An example of the surface morphology of free-standing diamond grown by CVD is illustrated in the representation of a scanning electron micrograph of FIG. 9. The exhibited surface morphology is indicative of polycrystalline diamond with very sharp edges. Importantly though, the crystallites seem to merge into each other without clearly defined grain boundaries of disordered or extraneous material. The roughness produced by such crystallites is desirable because some extraneous deposition often occurs on the dome or other chamber parts, as has been observed in the edge zone 64 of FIG. 2. A rough surface tends to securely hold the deposited layer while a smooth surface tends to slough off the solid material after it has coalesced in small areas. The released material tends to fall onto the wafer as particulates which, when incorporated into the integrated circuit being fabricated, are very likely to produce a faulty or at least unreliable integrated circuit. The rough material needs to be periodically cleaned, but it produces very particles.

SEMs taken of the same free-standing diamond film before and after the chlorine-based etched show little modification of the illustrated surface morphology. The lack of wide grain boundaries does not facilitate the liberation of crystallites during the etching, as is the case with alumina. Therefore, what little erosion occurs with diamond produces few particles.

As mentioned before, for etching deep features into a metal, it is desired to add fluorine to the predominately chlorine-based etching gas. The SEMs show that the additional fluorine has a tendency to soften the edges of the diamond crystallites. However, the same general rough polycrystalline structure is maintained. Accordingly, the diamond coated dome and other chamber parts such as diamond-coated chamber walls can be advantageously used for oxide etching, which is predominately based on fluorine chemistry.

Figure 1:
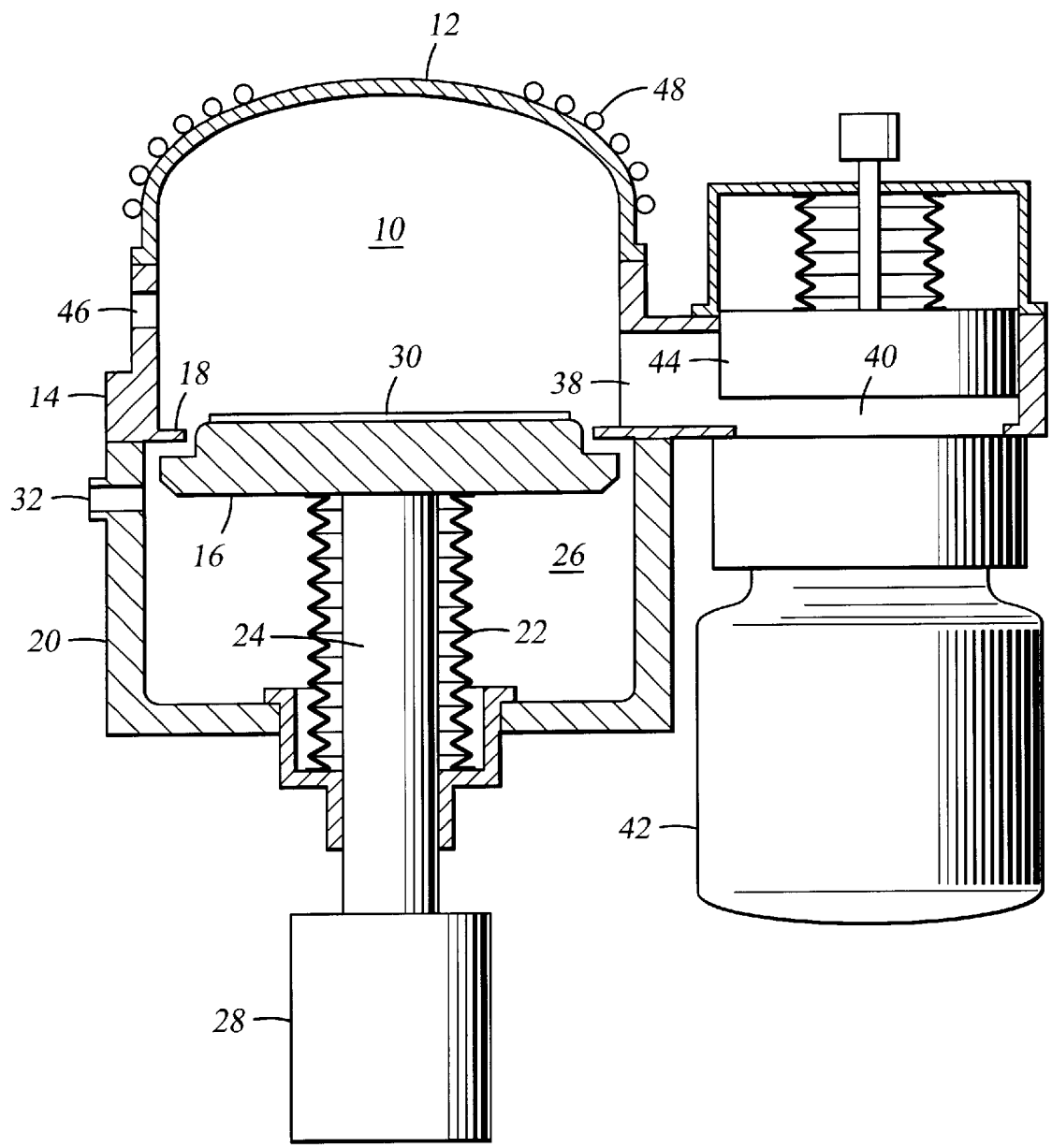
FIG. 1 is schematic cross-sectional view of a plasma reactor to which the invention can be applied.

Diamond coatings show even better erosion characteristics than boron carbide coatings. However, it is not considered feasible to coat diamond onto an aluminum chamber wall since the typical deposition temperatures of CVD diamond are near or above the melting point of aluminum, 660° C. Therefore, the preferred wall protection technique for the DPS reactor of FIG. 1 is to coat the dielectric dome 12 with diamond and to coat the aluminum chamber wall 14 with boron carbide. However, as noted above, diamond-coated SiC and SiC/Si composites can be substituted for the aluminum. Other shapes of dielectric inductive walls are possible, for example, a flat roof for a planar pancake coil or a cylindrical wall for a solenoidal coil.

Although the diamond coating is particularly useful on a dielectric window for inductive source, it can also be used with a dielectric window for a microwave source propagating microwave radiation from a microwave waveguide through the window into the chamber. Hooke et al. describe such a plasma reactor in U.S. Pat. No. 5,449,434. A diamond-coated microwave window is easier to fabricate than a dome or wall because of its relatively small area and planar shape. The diamond coating can also be applied to the interior sides of other vacuum chamber walls facing a plasma. If the wall can be left electrically floating, the wall base may be a typically insulative ceramic, and the diamond coating protects the ceramic from the plasma. If the wall needs to be electrically grounded or otherwise held at some electrical potential, the wall base may be polysilicon or a conductive ceramic such as doped silicon carbide and the diamond can be doped to be conductive.

Diamond coatings, particularly when applied to larger substrates, are likely to have a mixed crystal structure. Usually, the diamond layer is polycrystalline. Furthermore, the division between crystalline diamond and other forms of carbon is not always clear since amorphous carbon may have a substantial fraction of $sp^3$ atomic bonding, just as does diamond.

Although the invention is particularly useful for plasma etching reactors, particularly those for etching metal, it can be advantageously applied to other plasma reactors used in semiconductor processing and related manufacture. Chemical vapor deposition of metal layers may involve halogenated precursors that can be very corrosive, particularly in their plasma state. Furthermore, other types of planar substrates may be used with a reactor of the general configuration as the DPS reactor of FIG. 1, for example, glass or oxide ceramic. The substrates need not be circular but may be rectangular or have other shapes.

The invention thus provides increased lifetime for reactor parts and decreased production of particles while relying upon commercially available coating techniques and conventional chamber designs.

What is claimed is:

1. A plasma reactor for processing a substrate, comprising:
    a vacuum chamber into which a substrate is inserted for processing with a plasma formed in said chamber;
    a vacuum wall of said chamber comprising a dielectric bulk base and a diamond coating on a side of said bulk base facing said plasma in an interior of vacuum chamber; and
    a source of electromagentic radiation positioned on a side of said vacuum wall opposite said diamond coating.

2. The plasma reactor of claim 1, wherein said source of electromagnetic radiation comprises an RF inductive coil positioned adjacent to said vacuum wall.

3. The plasma reactor of claim 1, wherein said base comprises alumina.

4. The plasma reactor of claim 1, wherein said base comprises silicon nitride.

5. The plasma reactor of claim 1, wherein said base comprises polysilicon.

6. The plasma reactor of claim 1, wherein said base comprises silicon carbide.

7. The plasma reactor of claim 1, wherein said base comprises a SiC/Si composite.

8. A plasma reactor for processing a substrate, comprising:
    a vacuum chamber into which a substrate is inserted for processing with a plasma formed in said chamber; and
    a vacuum wall of said chamber comprising a metallic base and a carbon-based coating having an electrical resistivity of at least 1 ohm-cm and coated on a side of said bulk substrate facing said plasma in an interior of vacuum chamber and having an electrical resistivity of at least 1 ohm-cm.

9. The plasma reactor of claim 8, wherein said resistivity is at least 10 ohm-cm.

10. The plasma reactor of claim 8, wherein said carbon-based coating has a diamond crystal structure.

11. The plasma reactor of claim 8, wherein said carbon-based coating comprises amorphous carbon.

12. A plasma reactor for processing a substrate, comprising:
   a vacuum chamber into which a substrate is inserted for processing;
   a source of high-frequency electromagnetic radiation to couple electromagnetic energy into said chamber to form a plasma in an interior of said chamber; and
   a wall of said chamber separating said inductive coil and said interior comprising a dielectric base and a diamond coating on a side of said base facing said interior.

13. The plasma reactor of claim 12, wherein said source comprises an inductive coil.

14. The plasma reactor of claim 12, wherein said source comprises a microwave waveguide.

15. The plasma reactor of claim 12, wherein said vacuum chamber is configured for etching with a chlorine-based chemistry.

16. The plasma reactor of claim 8, wherein said base comprises a material selected from the group consisting of alumina, silicon carbide, and silicon nitride.

17. A plasma reactor for processing a substrate, comprising:
   a vacuum processing chamber including a chamber wall;
   a pedestal for supporting a substrate to be processed in an interior of said chamber;
   a dielectric member covering at least a portion of a top of said chamber;
   a diamond layer formed on a side of said dielectric member facing said interior; and
   an RF inductive coil positioned on a side of said dielectric member opposite said interior of said chamber.

18. The plasma reactor of claim 17, wherein said pedestal comprises a pedestal electrode and wherein said chamber wall comprises a metal chamber wall held at a predetermined potential.

19. The plasma reactor of claim 18, farther comprising:
   a first RF power supply connected to said coil; and
   a second RF power supply connected to said pedestal electrode.

20. The plasma reactor of claim 18, further comprising a boron carbide coating formed on a side of said metal chamber wall facing said interior.

21. A method of plasma processing, comprising:
   providing a plasma processing chamber having a pedestal and a dielectric wall including a diamond coating on a side of said wall facing and interior of said chamber;
   supporting a substrate to be processed on said pedestal;
   flowing a processing gas into said chamber;
   coupling RF energy through said dielectric wall and said diamond coating to excite said processing gas into a plasma to process said substrate.

22. The method of claim 21, wherein said processing gas is an etching gas, whereby said plasma etches said substrate.

23. The method of claim 22, wherein said etching gas comprises a halogen.

24. The method of claim 23, wherein said halogen is chlorine.

25. The method of claim 23, wherein said halogen is fluorine.

26. The method of claim 23, wherein said etching gas comprises chlorine and fluorine.

27. The method of claim 21, wherein said coupling step couples RF power into an inductive coil positioned on side of said wall opposite said interior of said chamber.

28. A ring member positionable on a pedestal in a plasma processing chamber surrounding a substrate to be plasma processed in said chamber, said ring member comprising:
   an annularly shaped silicon base; and
   a diamond coating formed on said silicon base.

29. The ring member of claim 28, wherein said diamond coating covers only a portion of said silicon base.

30. The ring member of claim 28, which is configured to act as at least one of a plasma guard, a plasma focus ring, and a clamp ring.

31. A part configured for use in a plasma substrate processing reactor and facing a plasma of said reactor, comprising:
   a base of a SiC matrix having voids filled with silicon; and
   a carbon-based coating over a surface of said base facing said plasma.

32. The part of claim 31, wherein said carbon-based coating comprises diamond.

33. The part of claim 31, wherein said carbon-based coating comprises amorphous carbon.

34. The part of claim 31, wherein said part is a chamber wall of said reactor.

35. A plasma processing reactor, comprising:
   a vacuum chamber;
   a gas port for admitting a processing gas into said chamber;
   a pedestal for supporting within said chamber a substrate to be plasma processed;
   a power source capable of exciting said processing gas in said chamber into a plasma; and
   a part positioned within said chamber facing said plasma and comprising
      a base of a SiC matrix having voids filled with silicon, and
      a carbon-based coating over a surface of said base facing said plasma.

36. The reactor of claim 35, wherein said processing gas is an etching gas and said plasma etches said suubstrate.

37. The reactor of claim 36, wherein said etching gas comprises a fluorine-containing gas.

38. The reactor of claim 35, wherein said carbon-based coating comprises diamond.

39. The reactor of claim 35, wherein said carbon-based coating comprises amorphous carbon.

40. The reactor of claim 35, wherein said part comprises a wall of said chamber.

\* \* \* \* \*